US007511346B2

(12) United States Patent
Yeh et al.

(10) Patent No.: US 7,511,346 B2
(45) Date of Patent: Mar. 31, 2009

(54) DESIGN OF HIGH-FREQUENCY SUBSTRATE NOISE ISOLATION IN BICMOS TECHNOLOGY

(75) Inventors: Der-Chyang Yeh, Hsin-Chu (TW); Chuan-Ying Lee, Hsinchu (TW); Victor P. C. Yeh, Taichung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 225 days.

(21) Appl. No.: 11/320,255

(22) Filed: Dec. 27, 2005

(65) Prior Publication Data

US 2007/0145489 A1 Jun. 28, 2007

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. .......................... 257/370; 257/41; 257/44
(58) Field of Classification Search .................. 257/41, 257/44, 47, 288, 347, 352, 499, 370, 371
See application file for complete search history.

(56) References Cited

U.S. PATENT DOCUMENTS

| | | | | |
|---|---|---|---|---|
| 5,134,537 A * | 7/1992 | Buss et al. | ............... | 361/154 |
| 5,332,920 A * | 7/1994 | Nakagawa et al. | ......... | 257/501 |
| 5,614,750 A * | 3/1997 | Ellul et al. | ............... | 257/386 |
| 6,268,778 B1 * | 7/2001 | Mucke et al. | ........... | 331/117 R |
| 6,268,779 B1 * | 7/2001 | van Zeijl | ............... | 331/117 FE |
| 6,429,502 B1 * | 8/2002 | Librizzi et al. | ............... | 257/510 |
| 7,038,292 B2 * | 5/2006 | Hsu | ......................... | 257/510 |
| 2002/0030199 A1 * | 3/2002 | Hirano et al. | ............... | 257/121 |
| 2003/0197242 A1 * | 10/2003 | Chen et al. | .................. | 257/509 |
| 2005/0029615 A1 * | 2/2005 | Tanaka et al. | ............... | 257/484 |
| 2005/0045956 A1 * | 3/2005 | Chen et al. | .................. | 257/355 |
| 2005/0179111 A1 * | 8/2005 | Chao | ......................... | 257/510 |
| 2005/0263843 A1 * | 12/2005 | Sakakibara | ................. | 257/500 |
| 2006/0017096 A1 * | 1/2006 | Yanagisawa et al. | ........ | 257/329 |
| 2006/0246652 A1 * | 11/2006 | Grivna et al. | ............... | 438/234 |

OTHER PUBLICATIONS

To, K. H., et al., "Comprehensive Study of Substrate Noise Isolation for Mixed-Signal Circuits," IEDM, 2001, pp. 519-522.
Pfost, M., et al., "An Experimental Study on Substrate Coupling in Bipolar/BiCMOS Technologies," IEEE Journal of Solid-State Circuits, vol. 39, No. 10, Oct. 2004, pp. 1755-1763.

* cited by examiner

*Primary Examiner*—Phuc T Dang
(74) *Attorney, Agent, or Firm*—Slater & Matsil, L.L.P.

(57) ABSTRACT

A high-frequency noise isolation structure and a method for forming the same are provided. The noise isolation structure isolates a first device region and a second device region over a semiconductor substrate. The noise isolation structure preferably includes a sinker region substantially encircling a first device region, a buried layer underlying the first device region and joining the sinker region, a deep guard ring substantially encircling the sinker region, and a deep trench oxide region substantially encircling the sinker region. The isolation structure further includes a wide guard ring between the first and the second device regions. The sinker region and the buried region preferably have a high impurity concentration. Integrated circuits to be noise decoupled are preferably formed in the respective first and second device regions.

19 Claims, 15 Drawing Sheets

DESIGN OF HIGH-FREQUENCY SUBSTRATE NOISE ISOLATION IN BICMOS TECHNOLOGY

TECHNICAL FIELD

This invention relates generally to integrated circuit isolation, and particularly relates to noise isolation between integrated circuits operated at high frequencies.

BACKGROUND

Recent advances in bipolar/BiCMOS IC design and fabrication make possible the integration of digital and analog circuits on the same IC chip. This technology is widely used in mobile communication systems where a digital core is combined with analog RF circuits. The digital and analog circuits are typically formed as a variety of components near one surface of a wafer. These components may be at several levels separated by inter-metal dielectric layers. Usually, the topmost layer is made of a dielectric material and serves as a passivation layer for the entire structure.

Figure 1:
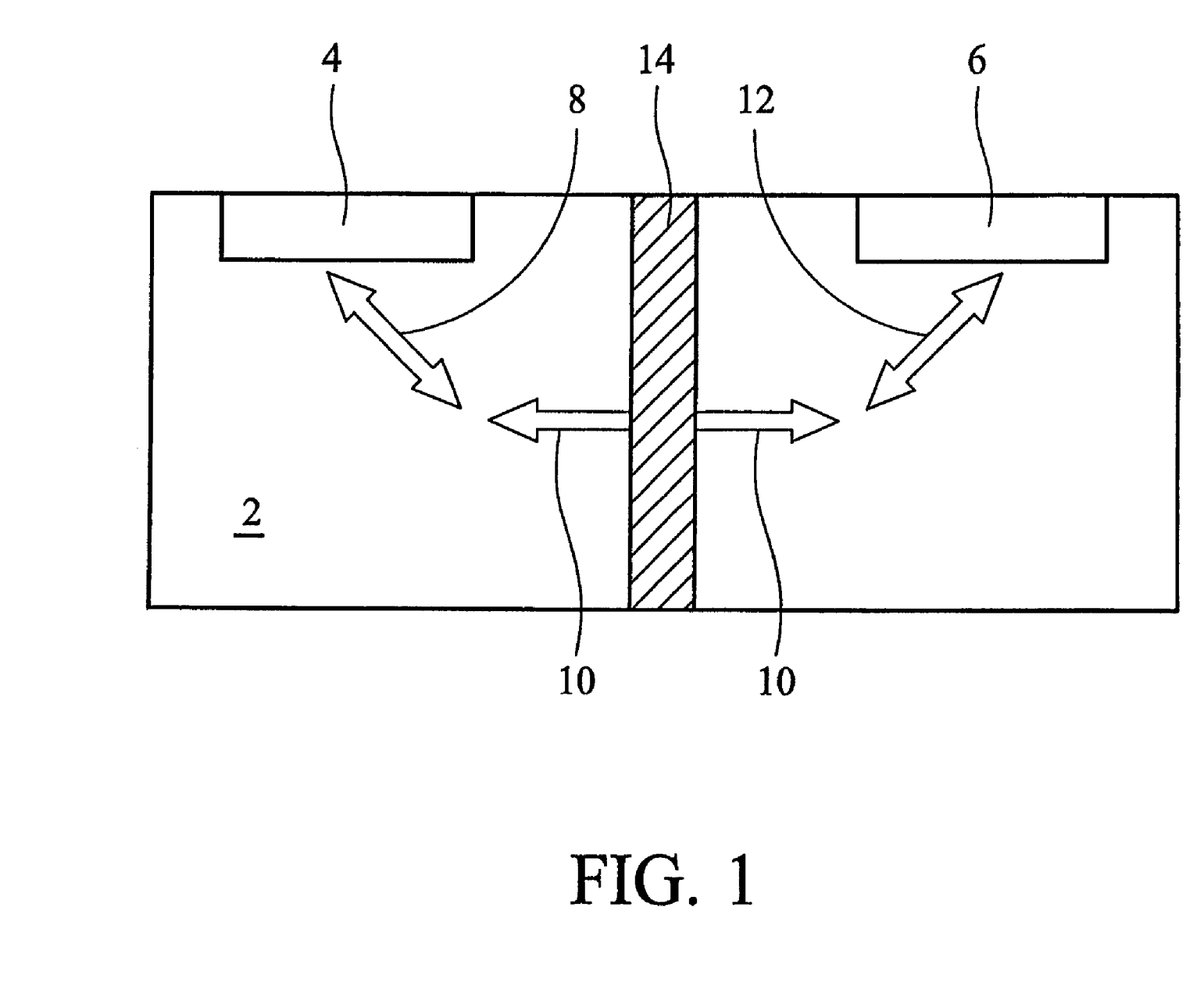
FIG. 1 illustrates a noise path in a substrate between a digital circuit region and an analog circuit region.

The integration of the digital and analog circuits causes noise coupling between digital and analog circuits. Analog circuits are especially affected by the noise generated in digital circuits. This significantly limits the performance achieved in analog signal processing and data conversion circuits, such as differential amplifiers that are extremely sensitive to the noise at the differential inputs. FIG. 1 illustrates a noise path between digital and analog circuits, wherein region 4 is a digital circuit region and region 6 is an analog circuit region. Arrows 8, 10 and 12 symbolize one of the noise paths in the substrate 2.

Besides the noise interference between digital circuits and analog circuits, noise interference also exists between digital circuit components.

There is a significant dependence of the noise coupling through the substrate on the constitution of the silicon substrate. Various methods have been developed to break the noise path in the silicon substrate. One commonly used method is forming isolation layers in the substrate. As shown in FIG. 1, an isolation layer 14 breaks the noise path between circuit regions 4 and 6. Isolation layer 14 is typically formed of dielectric materials. One example of isolation layer 14 is a trench isolation between the circuits to be isolated. To form deep trench isolations, trenches with nearly vertical sides are etched between the circuits and then filled with dielectric materials.

However, even deep trench isolation is not fully satisfactory when a full isolation between the circuits is required. This is particularly true when high-speed analog circuits are involved.

Figure 2:
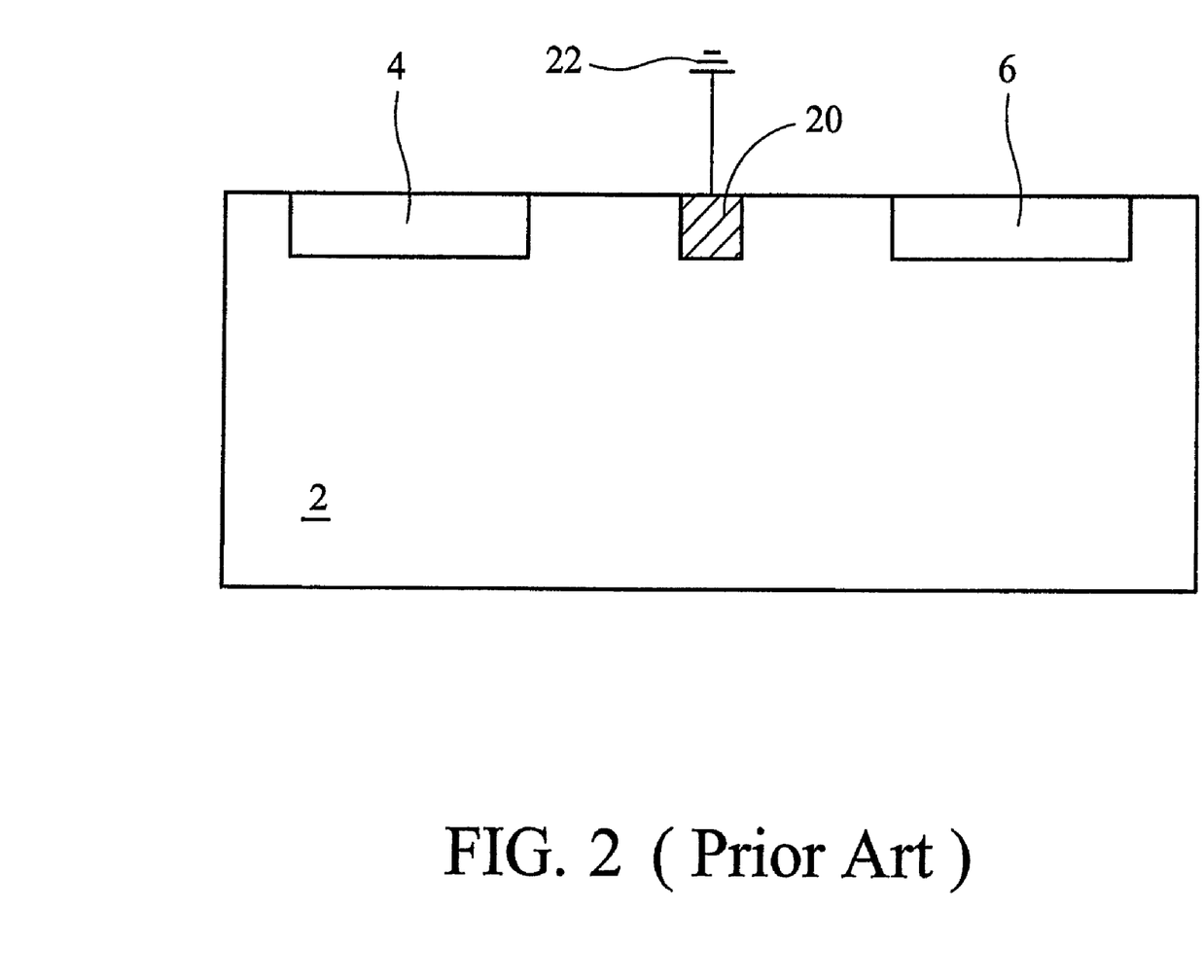
FIG. 2 illustrates a conventional method for forming a guard ring in a substrate to isolate the noise between a digital circuit region and an analog circuit region.

Another known method is placing a guard ring in the substrate and between the circuits to be isolated. As illustrated in FIG. 2, a p+ guard ring 20 is formed in a p– substrate 2. The guard ring 20 is grounded at node 22, thus creating a low resistivity path for the substrate noise. A noise current is more likely to take the low resistivity path to the guard ring 20 than a higher resistivity path to another circuit region.

Figure 3:
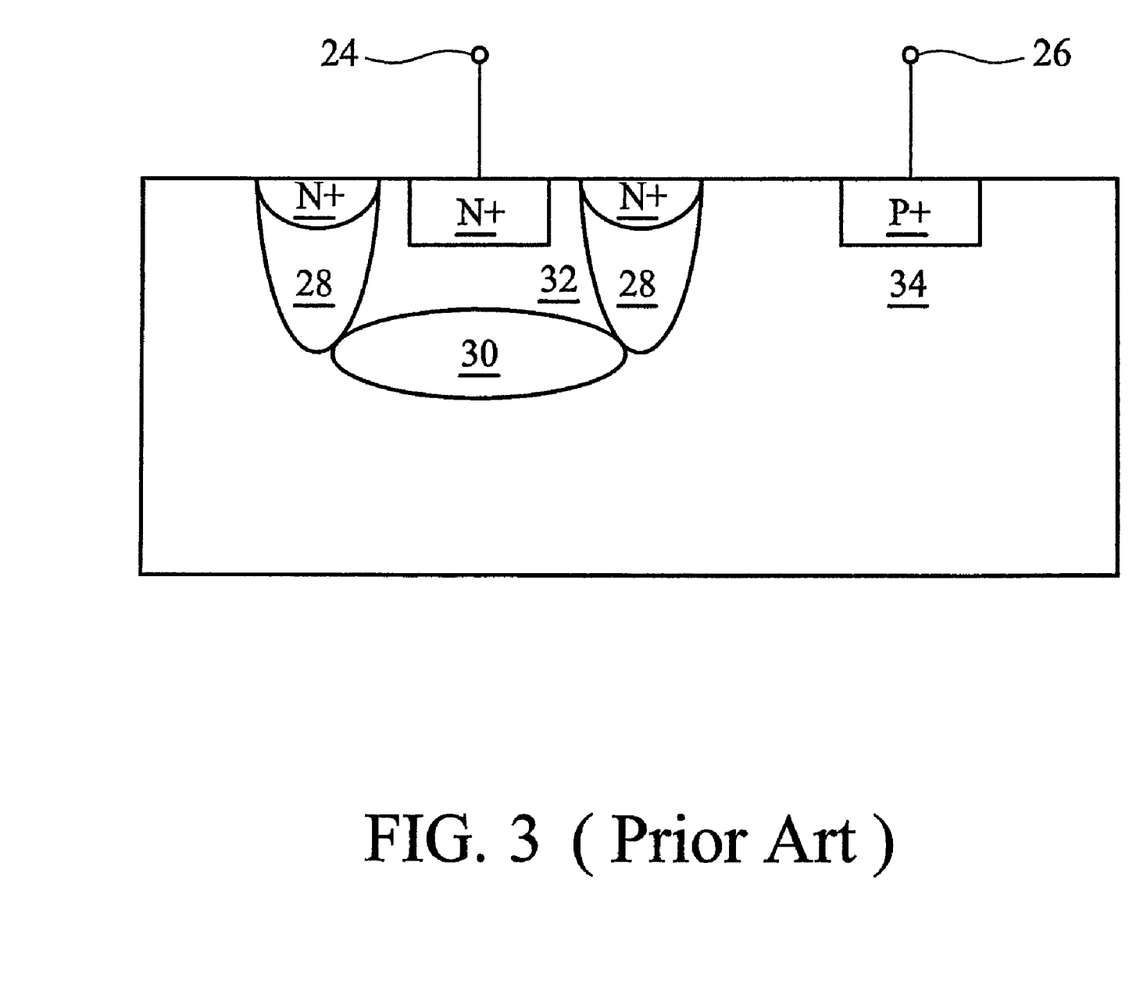
FIG. 3 illustrates a conventional noise isolation structure including a buried n-well region connected to a deep well region.

FIG. 3 illustrates yet another method. A noise signal source 24 is connected to a device region 32 surrounded by N-well regions 28 and deep N-well region 30. The noise signal is sensed from node 26, which is physically connected to a device region 34. Interconnected N-well regions 28 and deep N-well region 30, when grounded, form a low impedance path for noise. A noise current generated at signal source 24 is thus conducted to ground, and noise signal sensed at node 26 is significantly lower. With such a noise isolation structure, if one circuit is formed in device region 32 and another circuit is formed in device region 34, the noise coupling is significantly reduced. Research indicates that the noise coupling level represented by insertion loss parameter $S_{21}$ is about –60 dB at an operation frequency of about 1 GHz.

The previously discussed methods are effective for noise isolation. However, when the die size of the integrated circuit, which mostly consists of analog and digital blocks, becomes smaller in advanced technologies, and/or the frequency increases to over about 1 GHz, noise interference becomes more severe and better isolation techniques are needed.

SUMMARY OF THE INVENTION

A high-frequency noise isolation structure and a method for forming the same are provided.

In accordance with one aspect of the present invention, the noise isolation structure includes a sinker region substantially encircling a first device region, a buried layer underlying the first device region and joining the sinker region, a deep guard ring substantially encircling the sinker region, and a deep trench oxide region substantially encircling the sinker region. The sinker region and the buried region preferably have a high impurity concentration. Preferably, a wide guard ring is located between the first and the second device regions. The wide guard ring may have the shape of a closed loop or a rectangle. Integrated circuits to be noise decoupled can be formed in the first and second device regions.

In accordance with yet another aspect of the present invention, a method for forming the preferred embodiments of the present invention include providing a substrate having a first conductivity type, forming a buried layer in a top region of the substrate wherein the buried layer is of a second conductivity type opposite the first conductivity type, forming a doped semiconductor layer of the second conductivity type on the substrate and the buried layer, forming a well region of the first conductivity type horizontally spaced apart from the buried layer, and forming a sinker region of the second conductivity type encircling a first device region over the buried layer wherein the sinker region joins the buried layer. The method further includes forming a deep trench oxide region encircling the sinker region, wherein the deep trench oxide region extends substantially below a bottom surface of the buried layer, forming a deep guard ring of the first conductivity type encircling the sinker region wherein the deep guard ring extends substantially below a bottom surface of the buried layer, and AC-grounding the sinker region and the deep guard ring. Preferably, the doped semiconductor layer is formed by epitaxial growth, and the buried layer is formed by ion implantation.

The preferred embodiments of the present invention provide a good isolation between integrated circuits, particularly for integrated circuits operating at high frequencies.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The preferred embodiments are illustrated in FIGS. 4 through 12, wherein like reference numbers are used to designate like elements throughout the various views and illustrative embodiments of the present invention.

Figure 4:
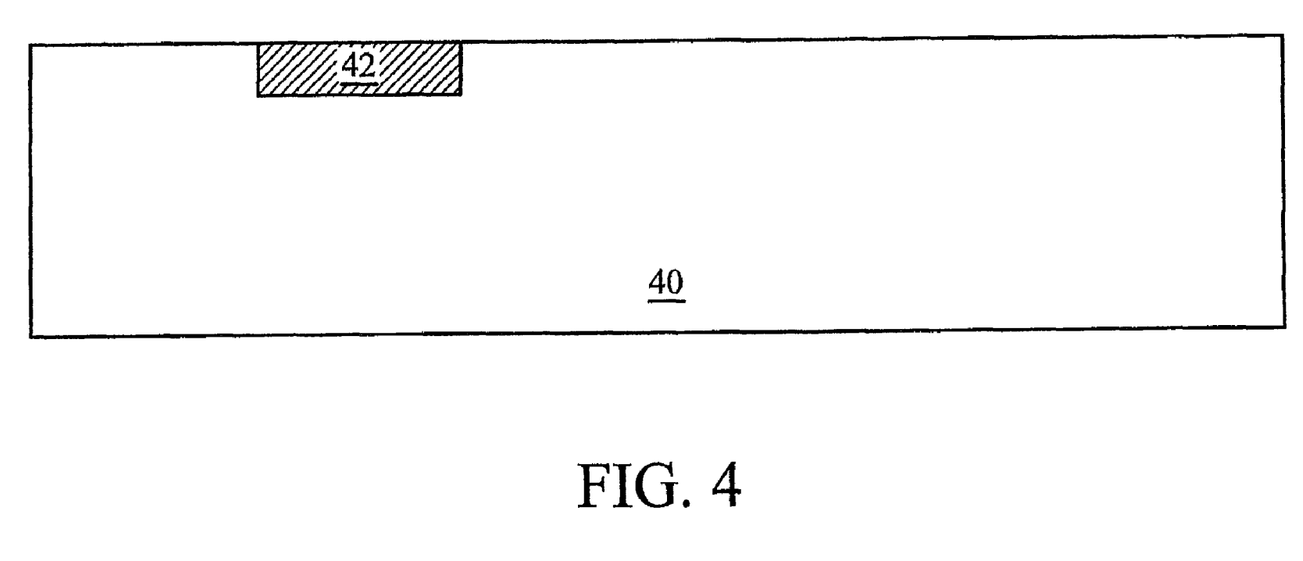
FIGS. 4 through 12 (except FIG. 11, which is a top view of the preferred embodiment), are cross-sectional views of intermediate stages in the manufacture of the preferred embodiment.

FIG. 4 illustrates the formation of an N+ buried layer (NBL) 42 in a substrate 40. Substrate 40 preferably comprises a semiconductor material such as silicon, although other semiconductor materials such as III-V group related compounds (for example, GaAs and InP) may also be used. In the preferred embodiment, substrate 40 is of p-type. In other embodiments, substrate 40 may comprise n-type impurities.

The NBL 42 is formed in a top region of the substrate 40 proximate the top surface. NBL 42 only occupies a sub region in substrate 40 and is preferably formed by implanting impurities into the top surface of the substrate 40. For example, antimony and/or arsenic may be implanted to an impurity concentration of greater than about $10^{19}/cm^3$, and more preferably between about $10^{19}/cm^3$ to about $10^{20}/cm^3$. The impurities of the NBL 42 may then be driven to a top region of the substrate 40, followed by furnace annealing the substrate 40. In alternative embodiments, if the substrate 40 is n-type, a P+ buried layer will be formed instead. The NBL 42 acts as an electrical isolation region, isolating the subsequently formed devices over the NBL 42 from the substrate 40.

Figure 5:
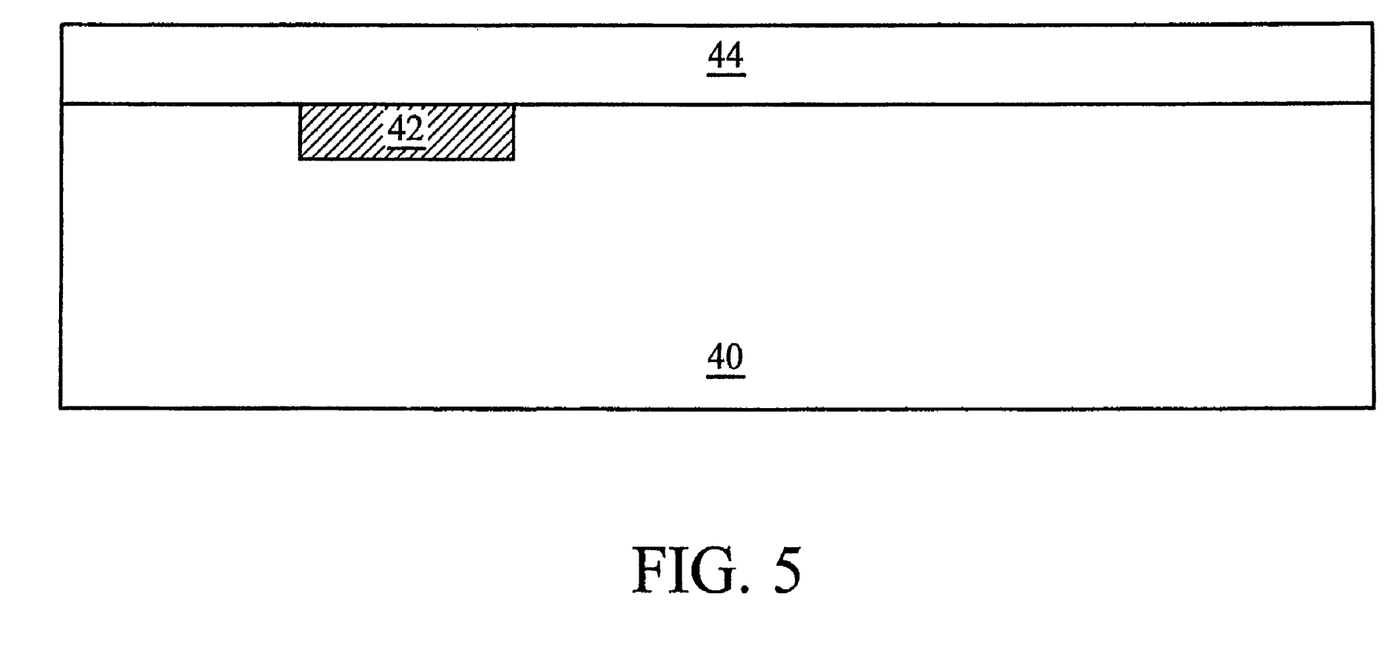

FIG. 5 illustrates a doped semiconductor layer 44 formed over NBL 42 and substrate 40. The doped semiconductor layer 44 preferably comprises a semiconductor such as silicon, and more preferably comprises a same semiconductor material as in the substrate 40. As the doped semiconductor layer 44 is preferably formed by epitaxial growth, it is also referred to as N-epi layer 44, although other deposition methods may alternatively be used. While epitaxially growing the semiconductor material 44, n-type impurities such as phosphorous are introduced, preferably to a concentration of between about $10^{15}/cm^3$ to about $10^{16}/cm^3$.

Figure 6:
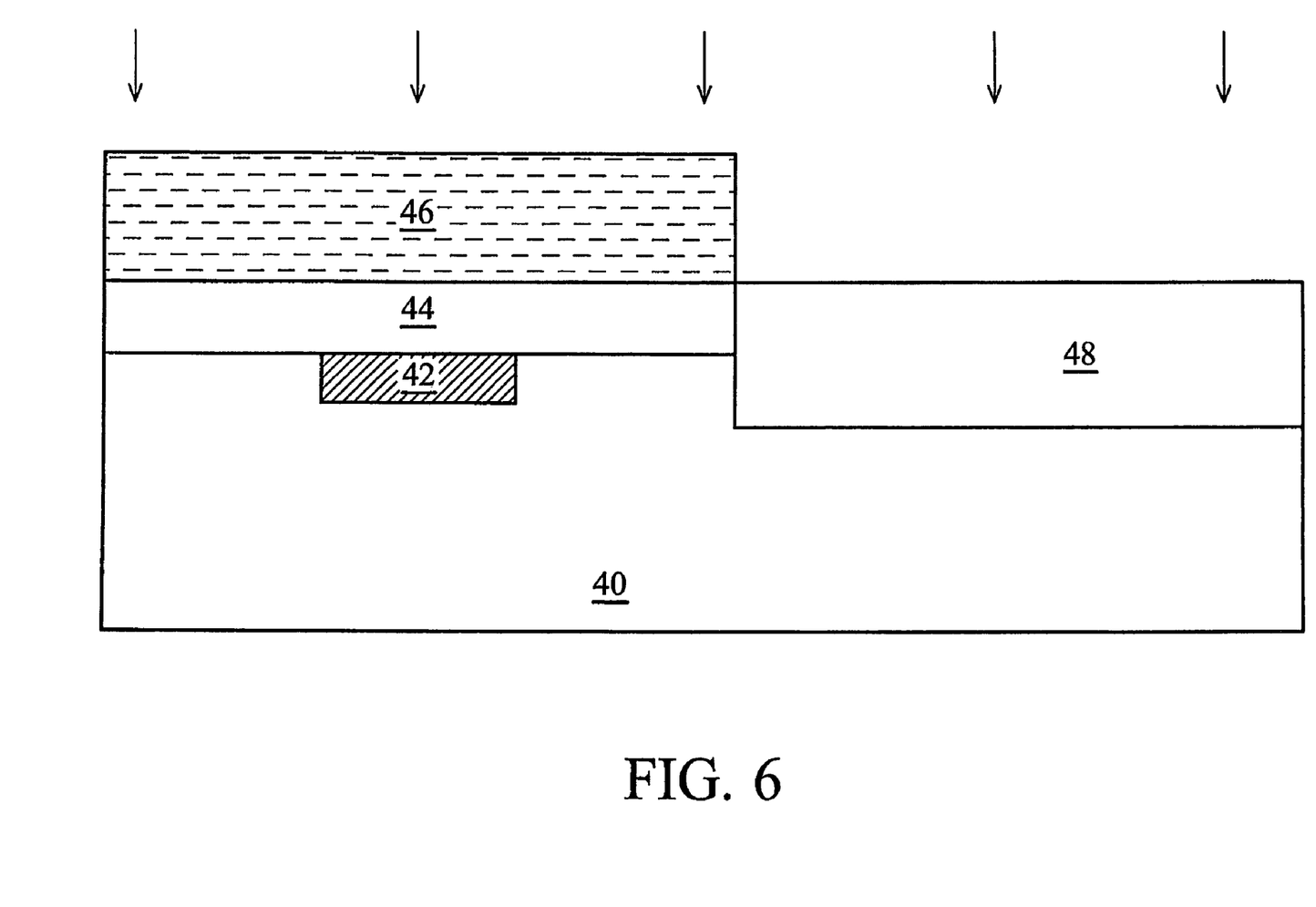

A photo resist 46 is formed and patterned using lithography techniques, as shown in FIG. 6. A p-type impurity implantation is then performed in order to form a P-well region 48. The P-well region 48 preferably comprises antimony and/or arsenic, which neutralizes the n-type impurities in the doped semiconductor layer 44 and converts the layer 44 to p-type. After the implantation, the P-well region 48 preferably has a net p-type impurity concentration of between about $10^{17}/cm^3$ and about $10^{18}/cm^3$. The bottom of the P-well region 48 preferably reaches below the bottom surface of the NBL 42, although a shallower P-well region 48 may be formed. Photo resist 46 is then removed.

Figure 7:
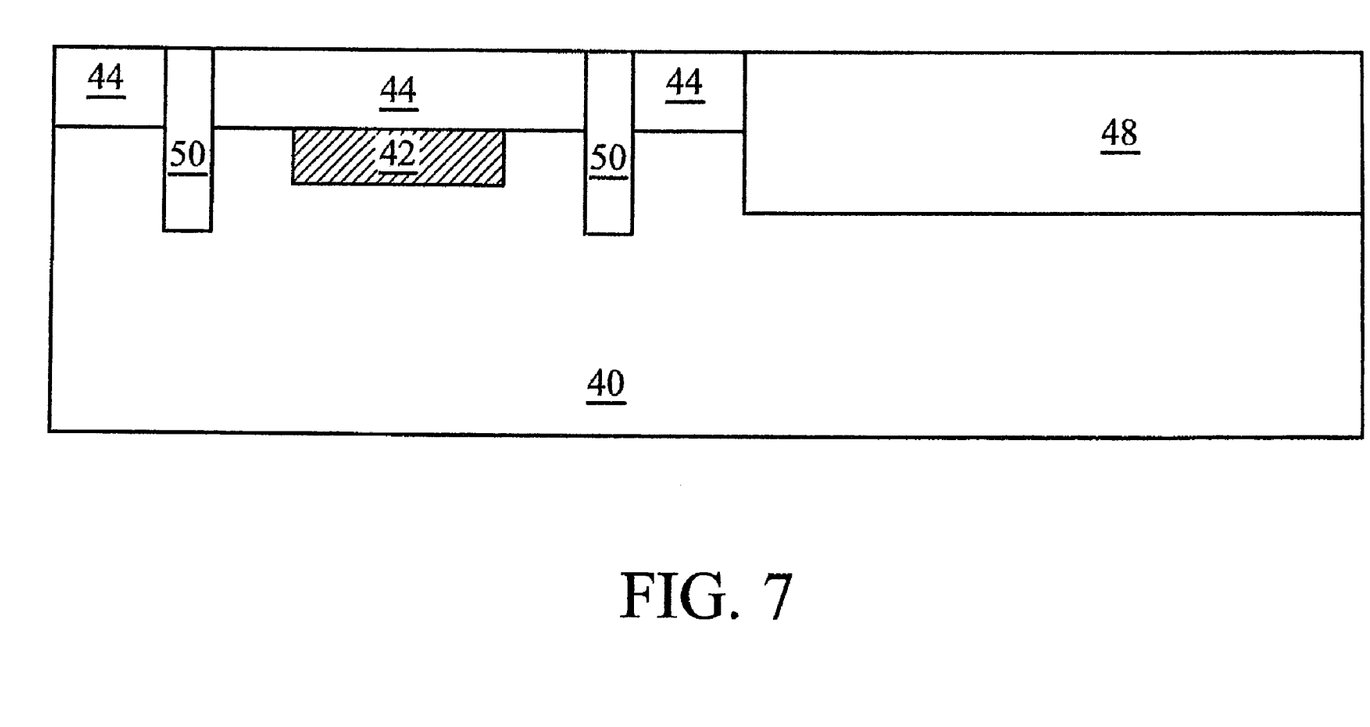

FIG. 7 illustrates the formation of deep trench oxide regions 50. In the preferred embodiment, the deep trench oxide regions 50 are formed by forming trenches, filling the trenches with a dielectric material, such as undoped polysilicon with lining $SiO_2$, $SiO_2$ or HDP oxide, and performing a chemical selective etching to level the surface. Although regions 50 are referred to as oxide regions as they are preferably formed of oxides, other dielectric materials can also be used, and they are alternatively referred to as trench isolation regions 50. The resulting deep trench oxide regions 50 preferably extend into the substrate 40 to isolate noise current paths. Preferably, deep trench oxide regions 50 extend below the bottom surface of the NBL 42. It is to be noted that although deep trench oxide regions 50 are shown as separate regions in a cross-sectional view, if viewed from top, they form one continuous region in the form of a closed loop encircling NBL 42.

Figure 8:
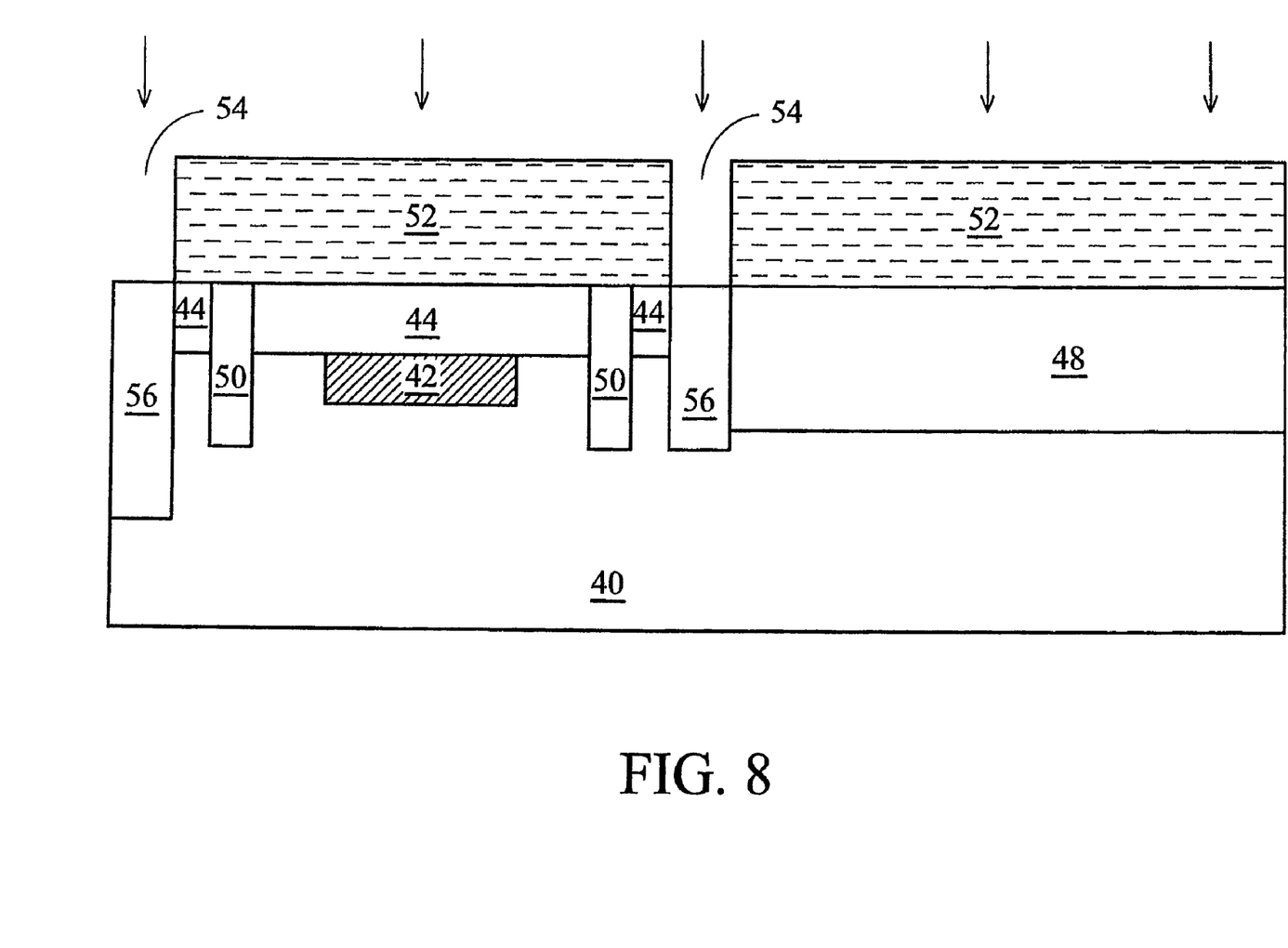

Photo resist 52 is formed and patterned, forming openings 54, as shown in FIG. 8. A p-type impurity implantation is performed, forming deep P-well guard rings 56. Preferably, the deep P-well guard rings 56 comprise carbon and/or other p-type impurities and are doped to a concentration of greater than about $10^{17}/cm^3$, and more preferably between about $10^{17}/cm^3$ and about $10^{18}/cm^3$. Deep P-well guard rings 56 preferably extend into the substrate 40, and more preferably extend below the bottom surface of the NBL 42. As is known in the art, by using different implant energies and different impurities, relatively deep guard rings 56 can be formed. Similar to the deep trench oxide regions 50, the deep P-well guard rings form a closed loop encircling the NBL 42. In the preferred embodiment, deep guard rings 56 encircle deep trench oxide regions 50 and both are formed outside of the P-well region 48. In other embodiments, deep trench oxide regions 50 may be formed outside the deep guard rings 56. In yet other embodiments, deep guard rings 56 and deep trench oxide regions 50 may be formed in the P-well region 48 or close to the boundary of the P-well region 48.

Figure 9:
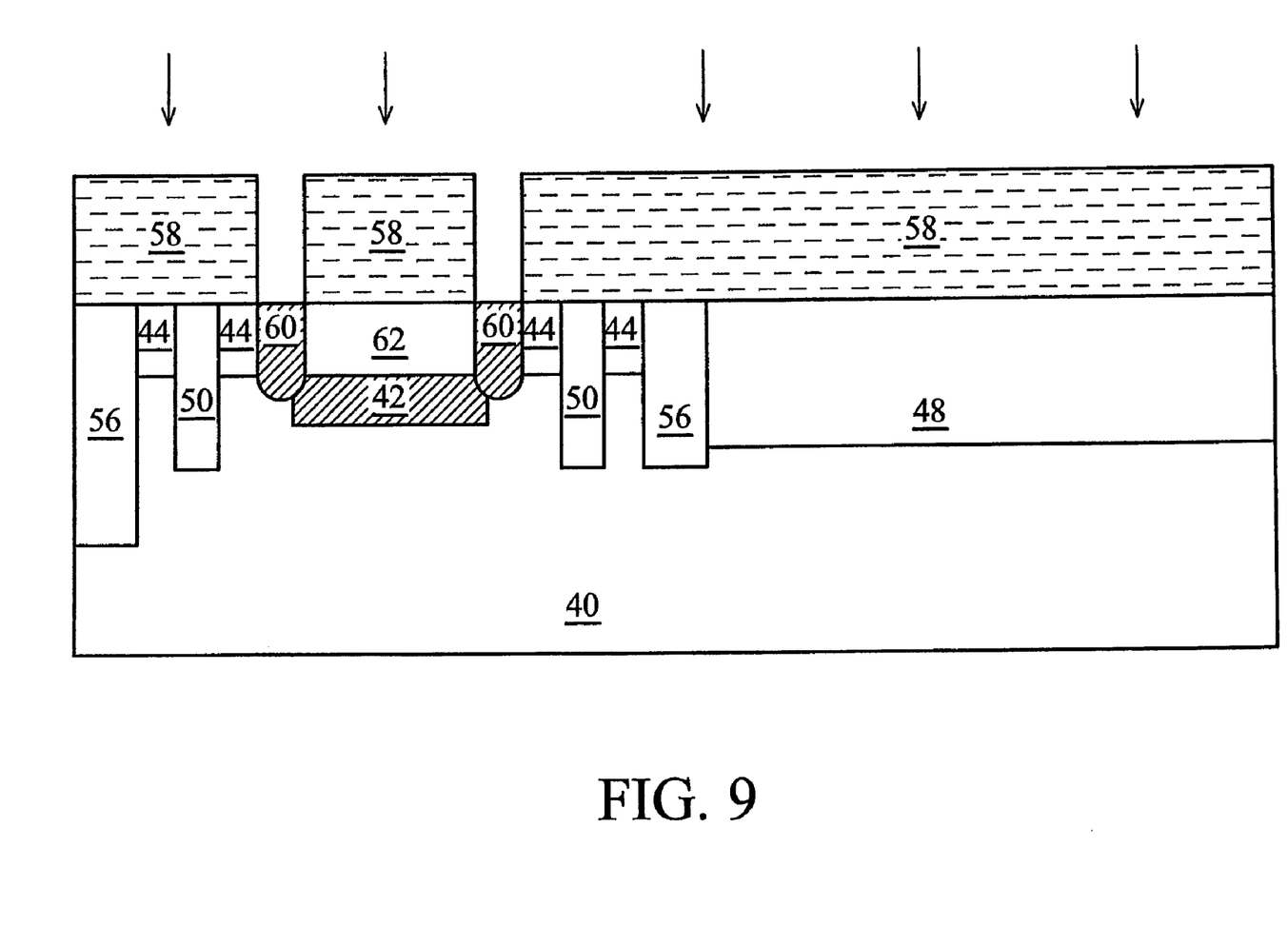

Referring to FIG. 9, photo resist 52 is removed and a photo resist 58 is formed and patterned. An n-type impurity implantation is performed, forming N+ sinker regions 60. The N+ sinker regions 60 are preferably heavily doped to a concentration of greater than about $10^{19}/cm^3$, and more preferably between about $10^{19}/cm^3$ and about $10^{20}/cm^3$. N+ sinker regions 60 and NBL 42 are preferably physically joined to define a device region 62. More preferably, no gap is left between the N+ sinker regions 60 and the NBL 42. If viewed from the top, N+ sinker regions 60 form a loop. After the implantation, photo resist 58 is removed.

In the described embodiments, heavily doped means an impurity concentration of above about $10^{19}/cm^3$. One skilled in the art will recognize, however, that heavily doped is a term of art that depends upon the specific device type, technology generation, minimum feature size, and the like. It is intended, therefore, that the term be interpreted in light of the technology being evaluated and not be limited to the described embodiments.

Figure 10:
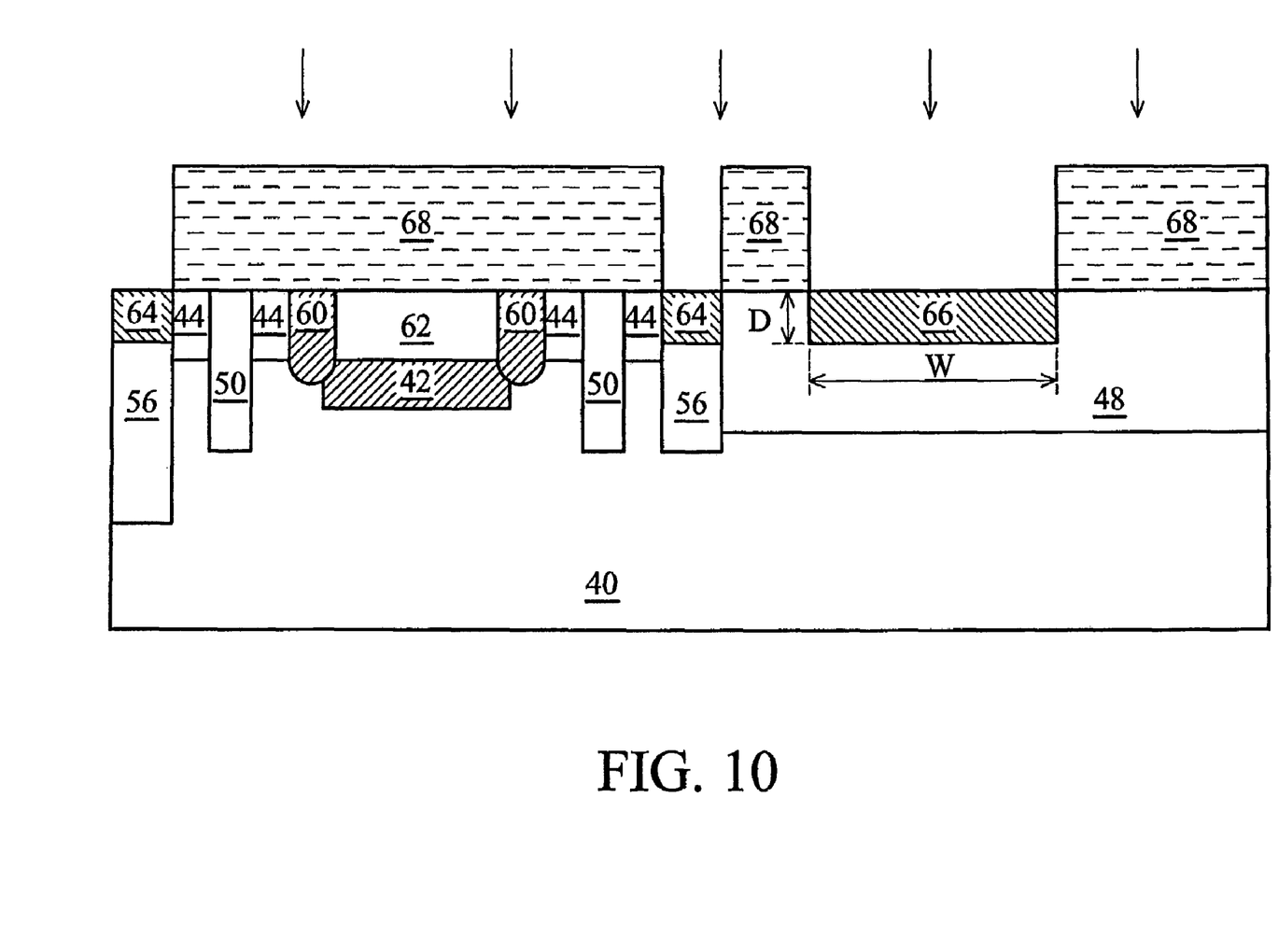

FIG. 10 illustrates the formation of P+ contacts 64 and a P+ guard ring 66. Similar to the formation of other doped regions, a photo resist 68 is formed and patterned, and a p-type implant is performed. In order to have low resistivity, the P+ contacts 64 and P+ guard ring 66 preferably have an impurity concentration of greater than about $10^{17}/cm^3$. In the preferred embodiment, the P+ guard ring 66 is formed simultaneously with the P+ contacts 64. In other embodiments, the P+ guard ring 66 is formed separately and has a greater depth than the P+ contacts 64. P+ guard ring 66 preferably has a depth D of greater than about 0.1 µm, and a width W of greater than about 20 µm. P+ guard ring 66 is alternatively referred to as a wide guard ring 66.

One skilled in the art will realize that the order for forming N+ sinker regions 60, deep trench oxide regions 50, deep guard rings 56, P+ guard ring 66 and contacts 64 is a matter of mere design choice, and these regions can be formed in different orders.

Figure 11:
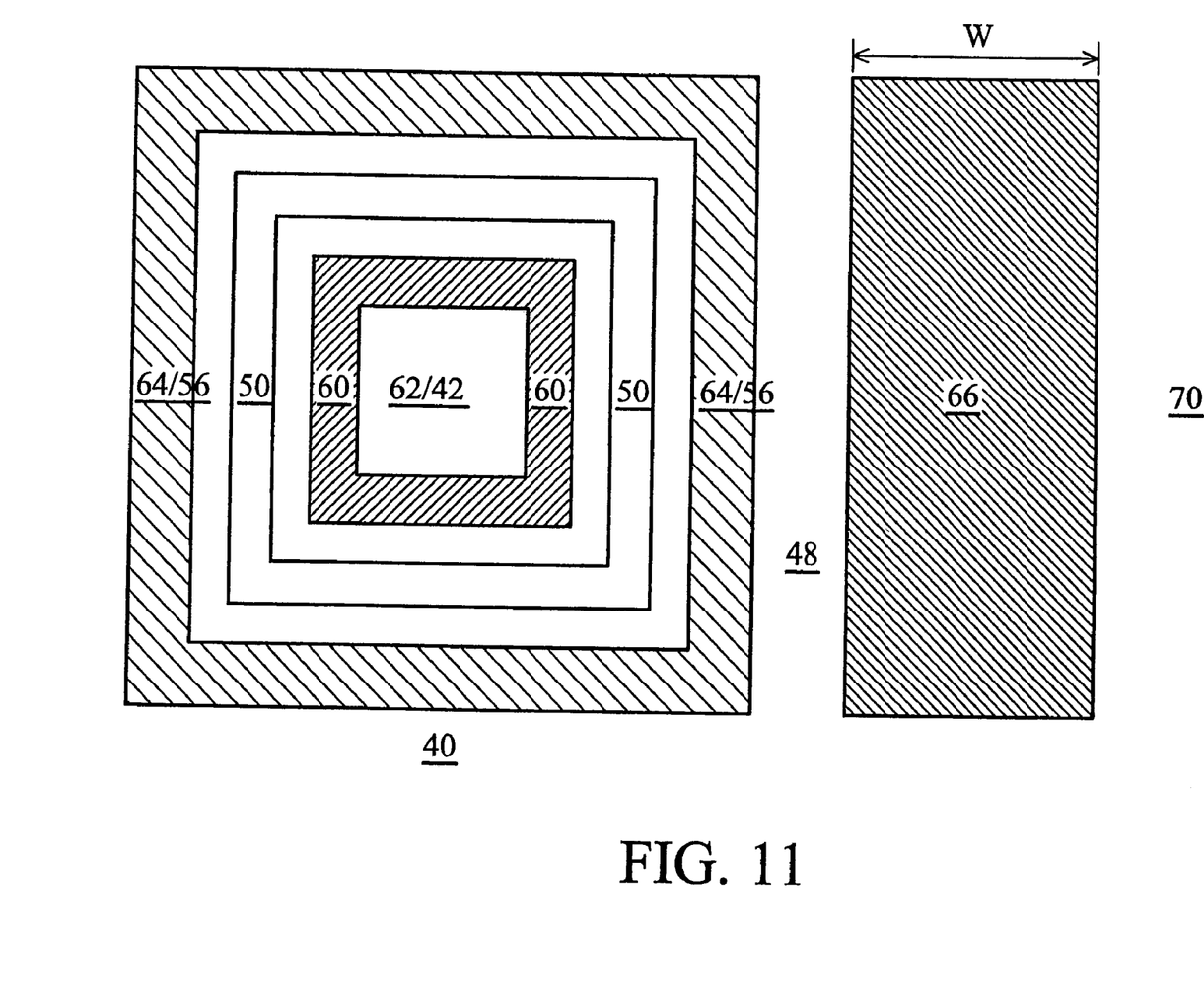

A top view of the previously formed structure is shown in FIG. 11. In the preferred embodiment, in order to maximize noise isolation ability, N+ sinker regions 60, deep trench oxide regions 50 and deep guard rings 56 all form closed-loops encircling device region 62. P+ guard ring 66, on the other hand, has a great width, therefore, is preferably a rectangular shaped region located between the device region 62 and another device region 70, which is preferably noise decoupled from device region 62. However, in alternative embodiments where chip area is not a concern, P+ guard ring may also form a closed loop around device region 62.

Figure 12:
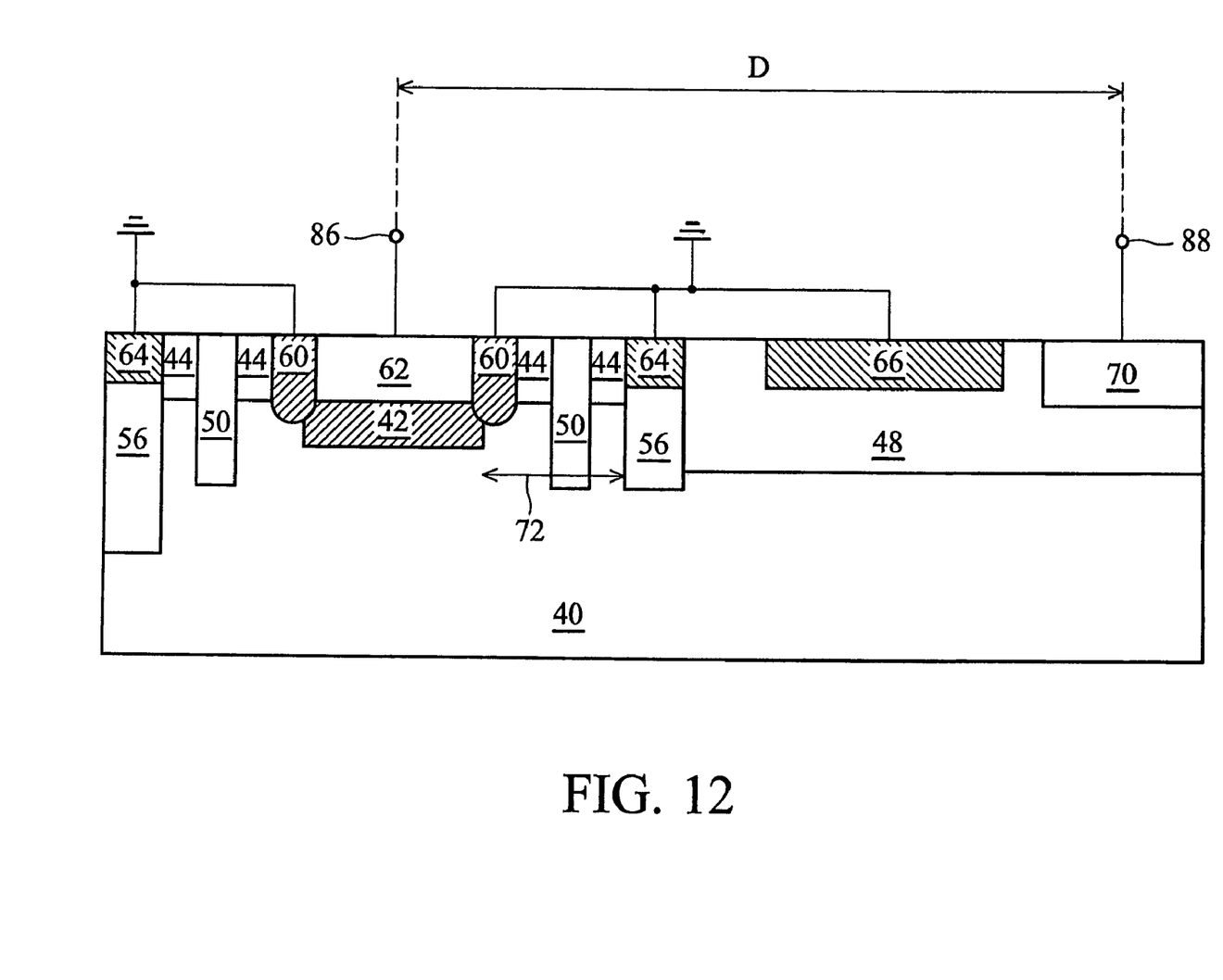

FIG. 12 illustrates an application of the preferred embodiment of the present invention, wherein N+ sinker regions 60, deep guard rings 56 and P+ guard ring 66 are AC-grounded. When a node is referred to as "AC grounded", it means that there is a low-impedance path existing between the node and the ground for an AC signal or noise. Preferably, when a node is AC-grounded, there is also a low impedance path for DC current.

In the preferred embodiment, several layers of noise isolation are combined to achieve a better noise isolation between the device regions 62 and 70. The first layer comprises N+ sinker regions 60 and NBL 42. These regions partially enclose the entire device region 62 with the top open. A noise current flowing between device region 62 and substrate 40 has to penetrate these regions. Since N+ sinker regions 60 and NBL 42 have a high impurity concentration, their parasitic capacitance C is high, and the corresponding impedance, which is $1/j\omega C$, is low. Particularly, when devices are operated at high frequencies, ω (equals $2\pi f$) is high, further lowering the impedance. Additionally, high impurity concentration causes low sheet resistance for DC currents. Therefore, a low impedance path exists, leading high frequency noise current to AC ground. Furthermore, a p-n junction is formed between n-type regions (NBL 42 and N+ sinker regions 60) and p-type regions (substrate 40 and P-well region 48), blocking noise currents flowing from the device region 62 to the p-type substrate 40 and P-well region 48.

Deep trench oxide regions 50 are noise current inhibitors. They form a high resistivity block on the noise path 72 between the device regions 62 and 70. Deep guard rings 56, on the other hand, create a low-impedance path conducting noise current to the AC ground.

P+ guard ring 66 also acts as a noise current sink with low impedance. Any noise current passing through the substrate 40 or P-well region 48 is likely to be diverted to the AC ground through P+ guard ring 66. With the P+guard ring 66 having a great width, noise current is more likely to be sunk to AC ground instead of flowing between device regions 62 and 70.

With the previously discussed isolation structure, device regions 62 and 70 are well isolated. Preferably, device region 62 is used as a digital circuit region and device region 70 is used as an analog circuit region. Conversely, device region 70 can be used as a digital circuit region and device region 62 can be used as an analog circuit region. Both regions can be used as analog regions or digital regions if noise isolation is demanded.

Figure 13:
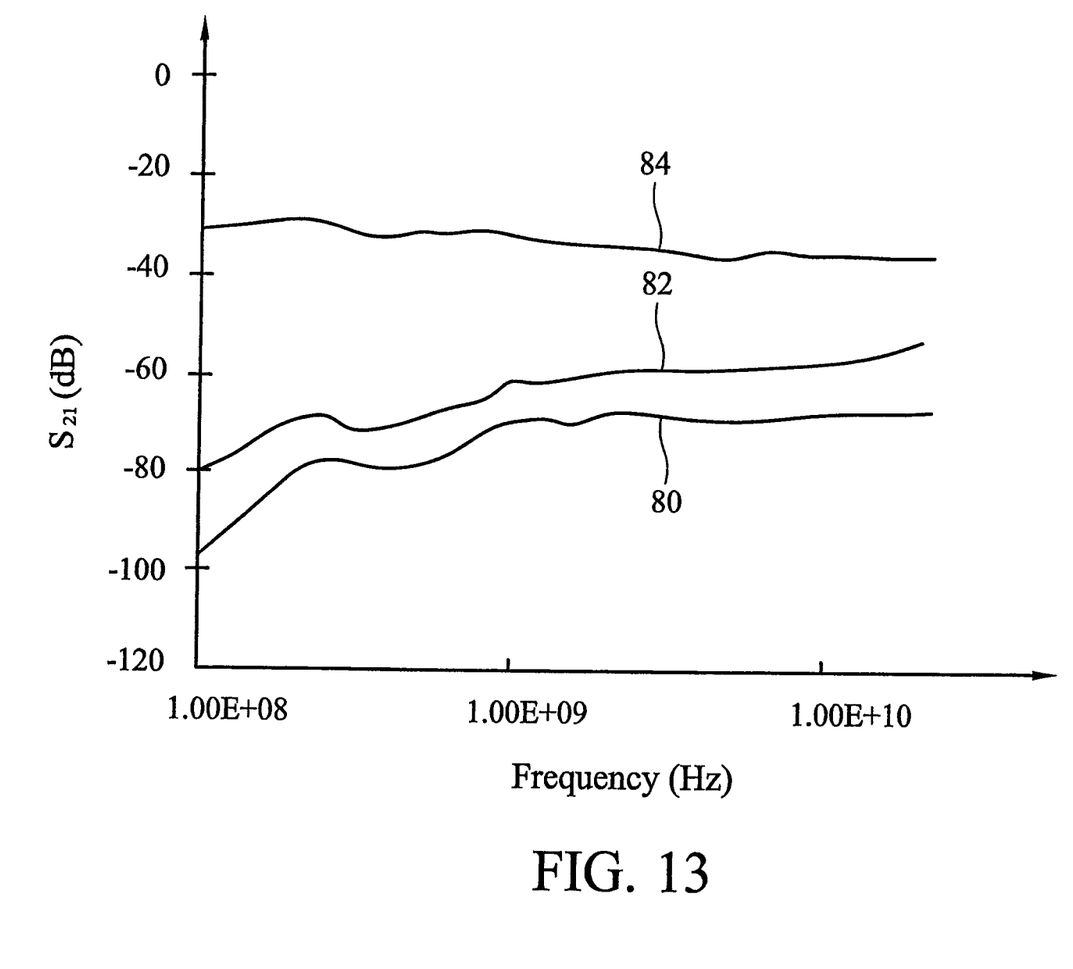
FIG. 13 illustrates measurement results, wherein sensed noise is shown as a function of frequency.
Figure 14:
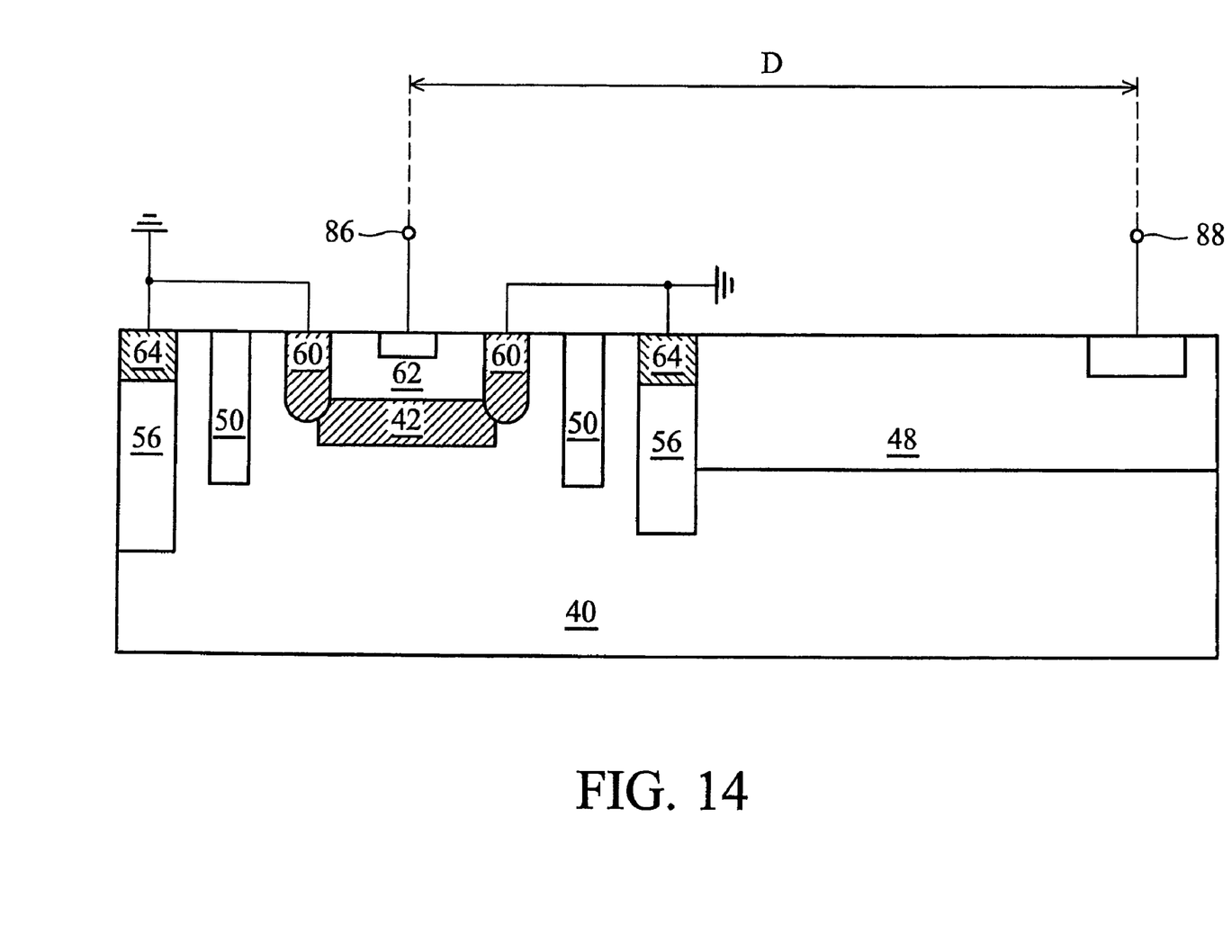
FIG. 14 illustrates a variation of the preferred embodiment of the present invention.
Figure 15:
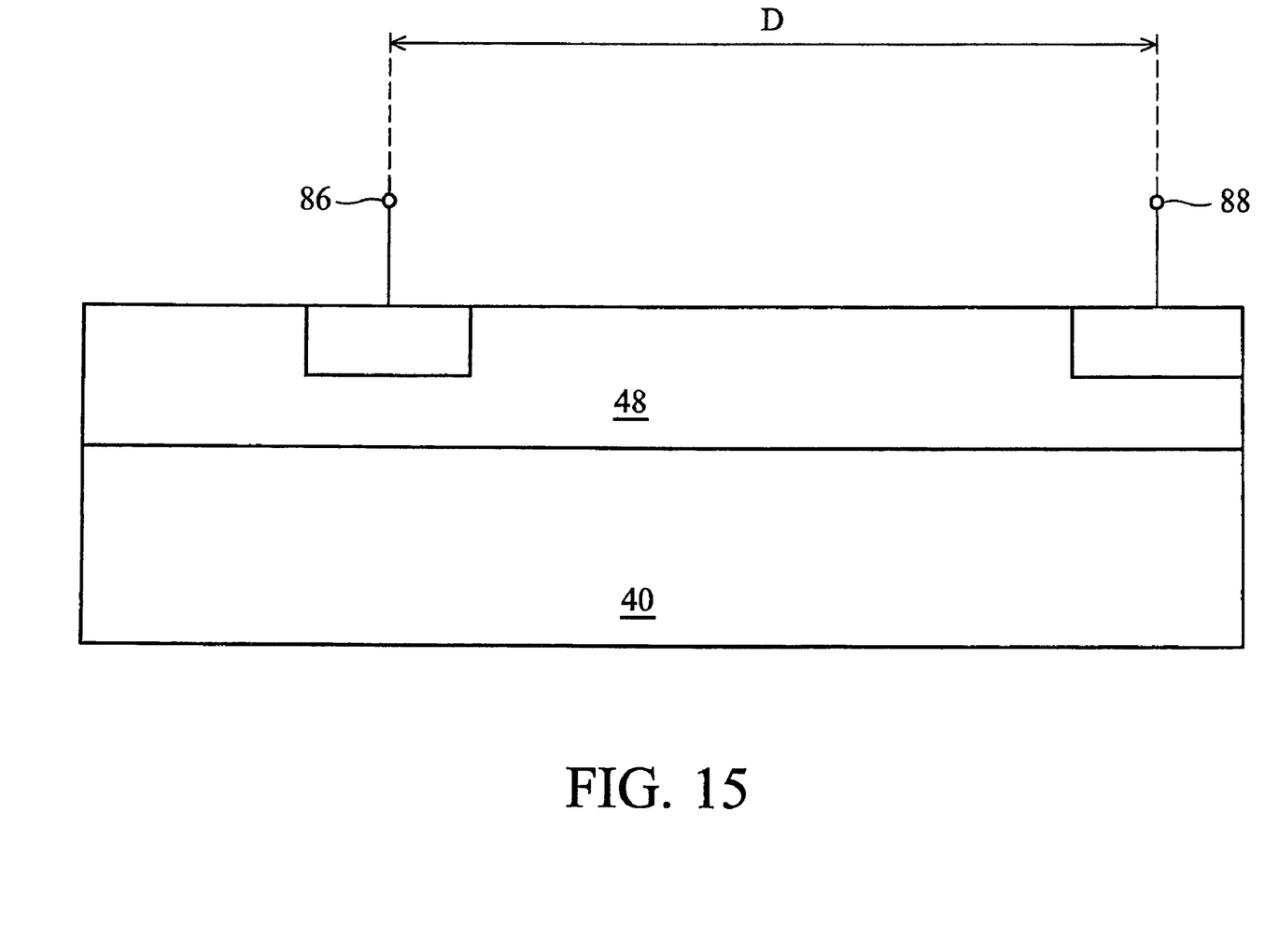
FIG. 15 illustrates a noise measurement setting, wherein no noise isolation structure is formed between a source node and a sense node.

The preferred embodiments of the present invention provide effective noise isolation, particularly when the die size of the integrated circuit scales down, the spacing between digital and analog circuit blocks shrinks, and/or the frequency increases to over about 1 GHz, since noise interference becomes more severe and better isolation techniques are needed. FIG. 13 illustrates noise levels 80, 82 and 84 as functions of frequency, wherein a source node 86 and a sense node 88 having a distance D of 50 µm (referring to FIGS. 12, 14 and 15) are used to measure noise coupling. Results from the preferred embodiments of the present invention are shown as line 80. At 1 GHz, the noise coupling parameter $S_{21}$ is found to be about −70 db. Line 82 shows measurement results obtained from a variation of the preferred embodiment, as shown in FIG. 14, wherein the P+ guard ring 66 is removed. The noise coupling parameter $S_{21}$ is found to be about −62 dB at 1 GHz. As a comparison, line 84 shows the noise coupling parameter $S_{21}$ measured in a circuit having no noise isolation, as shown in FIG. 15. A −33 db noise coupling parameter $S_{21}$ is obtained. This means that the present embodiment provides an extra noise reduction of about 37 dB at 1 GHz. Therefore, the preferred embodiments of the present invention have greatly improved the noise isolation between digital and analog regions in the integrated circuit.

Although the preferred embodiments provide a method of forming noise isolation structures in p-type substrates, one skilled in the art will realize that the teaching provided is readily available for the formation of noise isolation structures in n-type substrates, with the types of the respective regions inverted.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure comprising:
   a semiconductor substrate of a first conductivity type;
   a buried layer of a second conductivity type opposite the first conductivity type substantially in the semiconductor substrate and underlying a first device region formed of a semiconductor material, wherein the buried layer is heavily doped;
   a sinker region of the second conductivity type encircling the first device region and joining the buried layer, wherein the sinker region is heavily doped;
   a deep trench isolation region encircling the sinker region;
   a deep guard ring of the first conductivity type encircling the deep trench isolation region, wherein the deep guard ring extends below a bottom surface of the buried layer, wherein the sinker region and the deep guard ring are AC-grounded; and a second device region spaced apart from the first device region by at least the sinker region, the deep trench isolation region and the deep guard ring.

2. The semiconductor structure of claim 1, wherein the first conductivity type is p-type and the second conductivity type is n-type.

3. The semiconductor structure of claim 1 further comprising a wide guard ring of the first conductivity type between the first device region and the second device region.

4. The semiconductor structure of claim 3, wherein the wide guard ring has a width of greater than about 20 μm.

5. The semiconductor structure of claim 1, wherein the deep trench isolation region extends below the bottom surface of the buried layer.

6. The semiconductor structure of claim 1, wherein the buried layer and the sinker region have an impurity concentration of greater than about $10^{19}/cm^3$.

7. The semiconductor structure of claim 1 further comprising a P-well region underlying the second device region.

8. The semiconductor structure of claim 7, wherein the deep trench isolation region and the deep guard ring are substantially out of the P-well region.

9. The semiconductor structure of claim 1, wherein the first device region is a digital device region and the second device region is an analog device region.

10. The semiconductor structure of claim 1, wherein the first device region is an analog device region and the second device region is a digital device region.

11. A semiconductor structure comprising:
a semiconductor substrate of p-type;
an N+ buried layer substantially underlying a first device region and in the semiconductor substrate, wherein the N+ buried layer has an impurity concentration of greater than about $10^{19}/cm^3$;
an N+ sinker region encircling the first device region and joining the N+ buried layer, wherein the sinker region has an impurity concentration of greater than about $10^{19}/cm^3$;
a deep trench isolation region encircling the first device region, wherein the deep trench isolation region extends substantially below a bottom surface of the N+ buried layer;
a deep guard ring of p-type encircling the N+ sinker region, wherein the deep guard ring extends substantially below the bottom surface of the N+ buried layer;
a second device region spaced apart from the first device region by the sinker region, the deep trench isolation region and the deep guard ring; and
a P+ guard ring between the second device region and a region encircled by the deep guard ring and the deep trench isolation region, wherein the N+ sinker region, the deep guard ring and the P+ guard ring are AC-grounded.

12. The semiconductor structure of claim 11 further comprising a P-well region underlying the P+ guard ring and the second device region, wherein the P-well region has an impurity concentration substantially higher than an impurity concentration of the semiconductor substrate and substantially lower than an impurity concentration of the P+ guard ring.

13. The semiconductor structure of claim 11, wherein the P+ guard ring has a width of greater than about 20 μm.

14. The semiconductor structure of claim 11, wherein a digital circuit and analog circuit are each formed in one of the first device region and the second device region.

15. The semiconductor structure of claim 11, wherein the deep guard ring encircles the deep trench isolation region.

16. A semiconductor structure comprising:
a semiconductor substrate of p-type;
an N+ buried layer substantially underlying a first device region and in the semiconductor substrate;
an N+ sinker region encircling the first device region and adjoining the N+ buried layer;
a deep trench isolation region encircling the first device region, wherein the deep trench isolation region extends substantially below a bottom surface of the N+ buried layer;
a deep guard ring of p-type encircling the N+ sinker region, wherein the deep guard ring extends substantially below the bottom surface of the N+ buried layer;
a second device region spaced apart from the first device region by the sinker region, the deep trench isolation region and the deep guard ring; and
a P+ guard ring between the second device region and a region encircled by the deep guard ring and the deep trench isolation region.

17. The semiconductor structure of claim 16, wherein the N+ sinker region, the deep guard ring, and the P+ guard ring are AC-grounded.

18. The semiconductor structure of claim 16, wherein the P+ guard ring has a width of greater than about 20 μm.

19. The semiconductor structure of claim 16 further comprising a P-well region underlying the second device region.

* * * * *